(12) United States Patent
Diewald

(10) Patent No.: US 7,408,375 B2
(45) Date of Patent: Aug. 5, 2008

(54) METHOD AND TESTING APPARATUS FOR TESTING INTEGRATED CIRCUITS

(75) Inventor: Reiner Diewald, Heilbronn (DE)

(73) Assignee: ATMEL Germany GmbH, Heilbronn (DE)

( * ) Notice: Subject to any disclaimer, the term of this patent is extended or adjusted under 35 U.S.C. 154(b) by 0 days.

(21) Appl. No.: 11/710,466

(22) Filed: Feb. 26, 2007

(65) Prior Publication Data

US 2007/0159206 A1 Jul. 12, 2007

Related U.S. Application Data

(62) Division of application No. 11/095,488, filed on Apr. 1, 2005, now Pat. No. 7,199,601.

(30) Foreign Application Priority Data

Apr. 2, 2004 (DE) ............... 10 2004 017 787

(51) Int. Cl.
*G01R 31/26* (2006.01)
(52) U.S. Cl. ........................... 324/765
(58) Field of Classification Search .............. 324/765, 324/763, 760, 158.1, 761–762; 714/814–815, 714/735–736
See application file for complete search history.

(56) References Cited

U.S. PATENT DOCUMENTS

| 5,430,737 | A | 7/1995 | Yamashita et al. |
| 5,789,932 | A | 8/1998 | Michael |
| 6,327,678 | B1 * | 12/2001 | Nagai ..................... 714/700 |
| 6,400,173 | B1 * | 6/2002 | Shimizu et al. .............. 324/765 |
| 6,404,218 | B1 | 6/2002 | Le et al. |
| 6,479,983 | B1 | 11/2002 | Ebiya |
| 7,227,349 | B2 | 6/2007 | Kirkpatrick |

FOREIGN PATENT DOCUMENTS

| DE | 43 44 294 A1 | 6/1994 |
| DE | 195 28 733 C1 | 1/1997 |
| DE | 101 20 080 A1 | 11/2001 |
| EP | 1335208 A2 | 8/2003 |

\* cited by examiner

*Primary Examiner*—Ha Nguyen
*Assistant Examiner*—Tung X Nguyen
(74) *Attorney, Agent, or Firm*—Muncy, Geissler, Olds & Lowe, PLLC

(57) ABSTRACT

A method for testing integrated circuits comprises: generation of a change in an input signal of the integrated circuit, detection of a change in the output signal of the integrated circuit, the change triggered by the change in the input signal when a predetermined condition is satisfied, and a comparison of the detected output signal with at least one predetermined comparison criterion. Whereby, the predetermined condition is derived individually for each integrated circuit from a time response of the output signal.

5 Claims, 4 Drawing Sheets

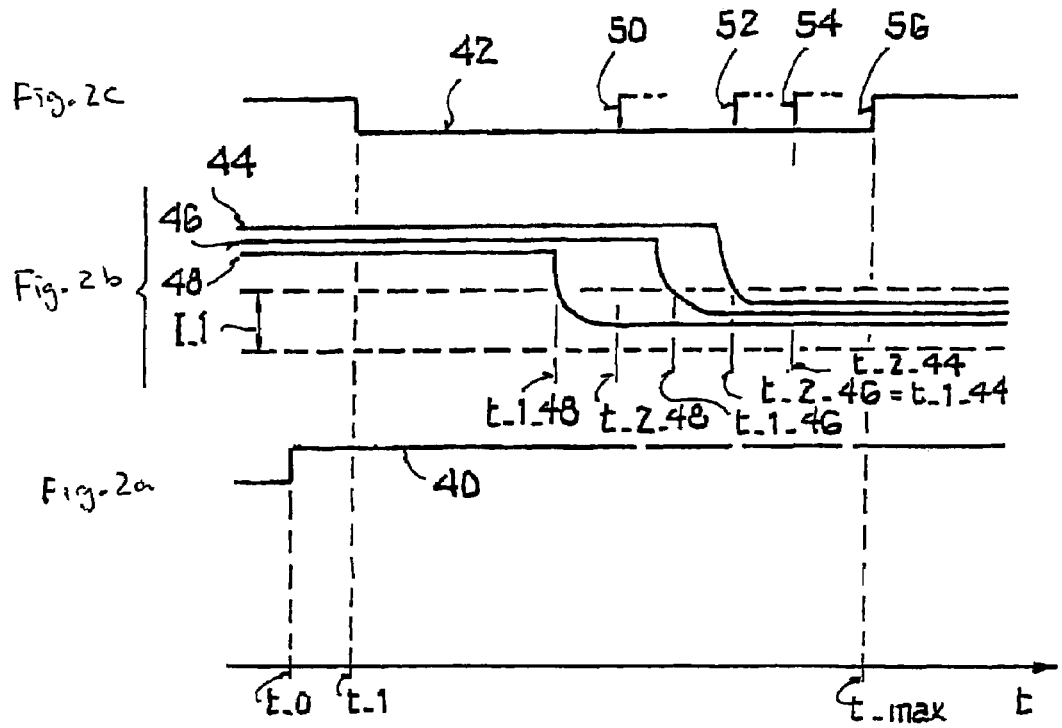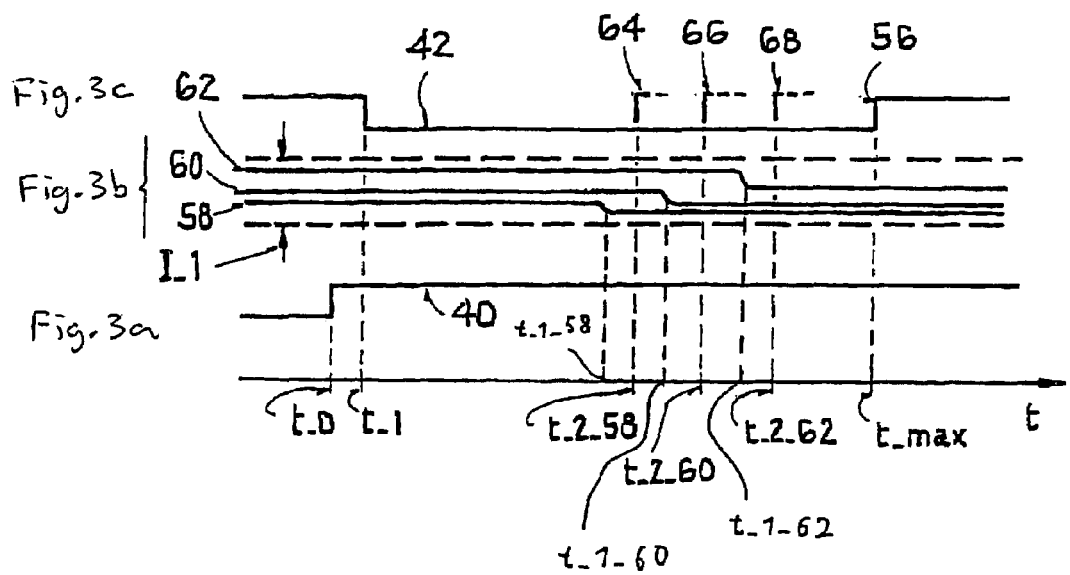

METHOD AND TESTING APPARATUS FOR TESTING INTEGRATED CIRCUITS

This is a divisional application under 37 C.F.R. §1.53(b) of prior application Ser. No. 11/095,488 filed on Apr. 1, 2005, now U.S. Pat. No. 7,199,601 the entire contents of which are hereby incorporated by reference.

BACKGROUND OF THE INVENTION

1. Field of the Invention

The present invention relates to a method and apparatus for testing integrated circuits (ICs).

2. Description of the Background Art

Integrated circuits are produced by the millions. A zero error rate is required for some applications, for example, in integrated circuits for safety-relevant functions such as the control of an airbag release. For this reason, each individual integrated circuit, which is intended for this type of application, is tested for its proper function after being manufactured. In a few safety-critical applications as well, production must be tested at least by spot checking, which in the case of the indicated quantities still produces very high numbers of integrated circuits to be tested.

In conventional testing methods, there is a requirement that after a change in the input signal a fixed waiting time must pass before a measured value of an output signal reaction is detected that is then used as a predetermined condition. This waiting time takes into account a production series-specific delay, with which integrated circuits respond to a stimulating input signal change. Actual delays, which occur in individual circuits, can have deviations due to deviations of the component parameters in different representatives of a series of integrated circuits from the same production series, so that some integrated circuits respond earlier and other integrated circuits respond later to an input signal change.

To enable a reliable differentiation between good and bad integrated circuits, the fixed waiting time must be predetermined so that, also within the scope of permitted fluctuations, integrated circuits that respond admittedly more slowly but always with still sufficient speed can still be recognized as being good. The result is that measured values for rapidly responding components within the scope of permitted fluctuations are received unnecessarily late, which in fact is not critical for the quality of the measurement, but lengthens the measuring time required for testing a large number of similar integrated circuits. This lengthening of the test time reduces the throughput of an individual testing apparatus, so that more testing apparatuses must be provided for a preset rate for testing integrated circuits. The lengthened measuring time must therefore be absorbed in higher investment for more testing apparatuses, associated manipulating systems, mounting surfaces, power supply, etc.

SUMMARY OF THE INVENTION

It is therefore an object of the present invention to provide a method and a testing apparatus by which the aforementioned disadvantages are reduced.

This object is achieved by deriving the predetermined condition individually for each integrated circuit from a time response of the output signal.

Furthermore, this object is achieved in a testing apparatus in that the testing apparatus derives the predetermined condition individually for each integrated circuit from a time response of the output signal.

By deriving IC-individual predetermined conditions from the individual time response of the output signal of an integrated circuit, more rapidly responding integrated circuits within the scope of a test can be tested earlier than by the prior-art method. This produces a shorter testing time overall with averaging over many test cycles, so that the number of tested integrated circuits dealt with by a testing apparatus increases. As a result, at a preset quantity of integrated circuits to be tested, the number of testing apparatus, including associated manipulators, can be reduced, which reduces the space required for the entire testing unit and the average test costs for each individual integrated circuit.

In an example embodiment of the present invention, the output signal can be continuously monitored after a change in the input signal and the predetermined condition is regarded as having been satisfied when the output signal enters a predetermined value range.

This example embodiment is suitable for, for example, integrated circuits in which there is a relative strong response to the output signal. The entry of the output signal into a predetermined value range requires that the output signal first lies outside the value range. The entering into the range therefore shows that a response has generally occurred, which optionally can already be evaluated as a sign of a functional IC.

Alternatively or in addition, starting at this time, however, the process can also wait for a certain amount of time until the output signal form settles. The individual testing time then includes the sum of the waiting time and the preceding circuit-specific time interval between stimulation of the integrated circuit and the entry of the output signal into the predetermined value range.

The predetermined condition can therefore be regarded as having been satisfied when after the output signal enters a predetermined value range, a predetermined minimum waiting time has passed.

Furthermore, the predetermined condition can be regarded as having been satisfied when, after the output signal enters the predetermined value range, a slope of the form of the output signal over time falls below a predetermined threshold.

This embodiment has an additional advantage in that both time intervals, thus, the time interval between a stimulation of the circuit and the entry into the value range, as well as the time interval between the entry and the receipt of the actual measured value, e.g., the value of the output signal at the time when the predetermined condition is satisfied, are circuit-specific. This results in further shortening of the test time and thereby a further increase in the rate by which an individual testing apparatus tests integrated circuits.

The predetermined condition can be regarded as having been satisfied when after the output signal enters the predetermined value range, a percent change in the output signal exceeds a predetermined threshold.

In such an example embodiment, both aforementioned time intervals are circuit-specific, so that comparable advantages arise here. The difference between the two embodiments is that the slope depends on the difference between two output signal values, whereas the percent change results as a function of the quotient of the two output signal values.

In a further example embodiment, the predetermined condition can be regarded as having been satisfied when a percent change in the output signal, triggered by a change in the input signal, exceeds a predetermined threshold.

This example embodiment differs from the aforementioned embodiments in that it does not require that the output signal lies outside the predetermined value range at the beginning. In circuits in which the output signal is within the predetermined value range at the outset, it can be determined in this way whether a sufficient change occurs at all as a response to stimulation. This embodiment is thereby suitable particularly for integrated circuits with low output signal amplitudes.

The testing apparatus should continuously monitor the output signal after a change in the input signal and the predetermined condition is evaluated as having been satisfied when the output signal enters a predetermined value range.

It is also preferred that the testing apparatus should continuously monitor the output signal after a change in the input signal and the predetermined condition is evaluated as having been satisfied when a percent change in the output signal, triggered by a change in the input signal, exceeds a predetermined threshold.

It is further preferred that the testing apparatus of at least one of the aforementioned embodiments executes the method.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIGS. 2a-c show signal forms, which a testing apparatus within the scope of a first embodiment outputs and/or detects over time;

FIGS. 3a-c show signal forms, which a testing apparatus within the scope of a second embodiment outputs and/or detects over time;

DETAILED DESCRIPTION

Figure 1:
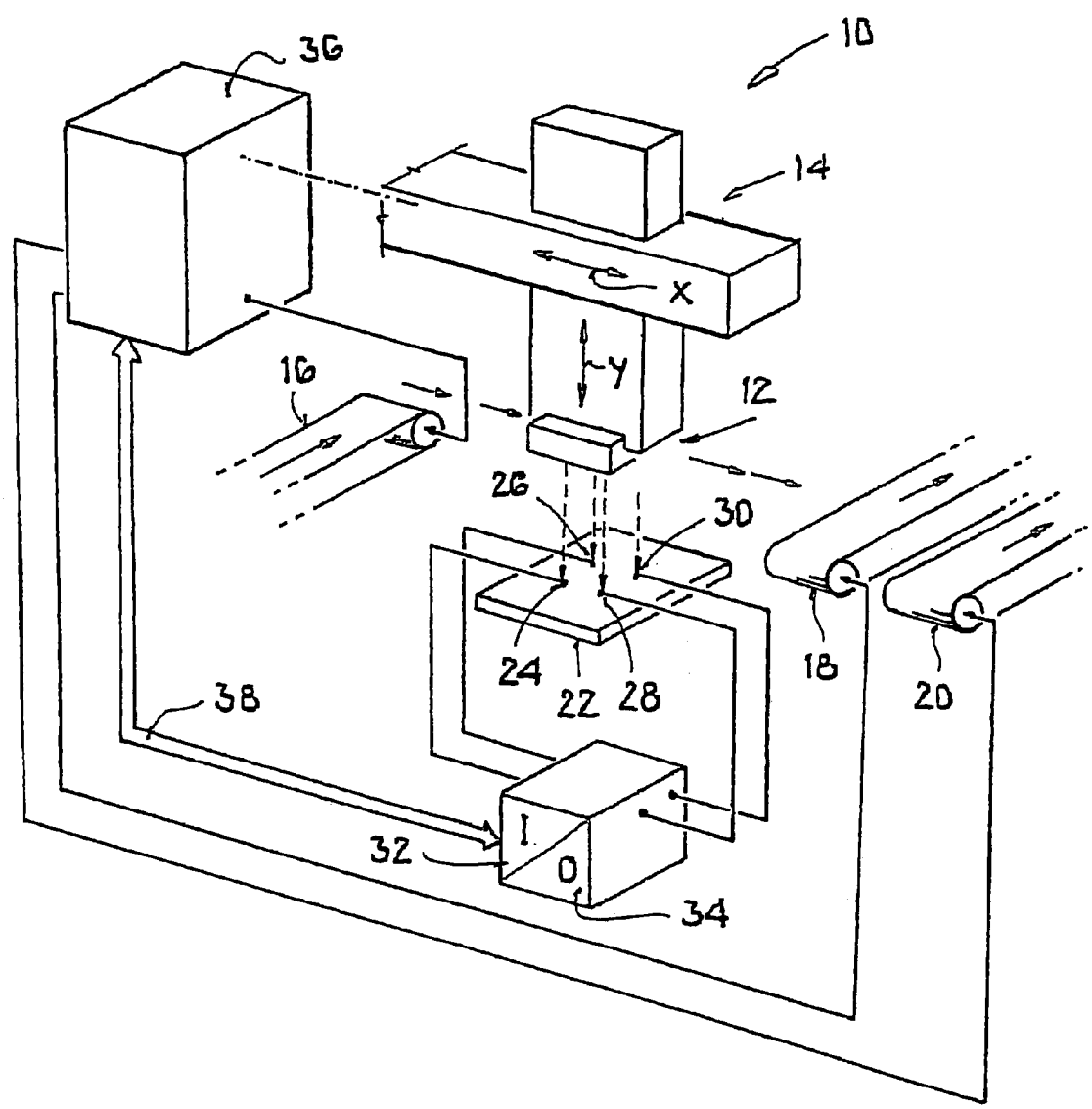
FIG. 1 illustrates a testing apparatus for testing integrated circuits.

FIG. 1 shows a testing apparatus 10 for testing integrated circuits 12 with a gripping device 14, delivery transporter 16, a first removal transporter 18 for integrated circuits that satisfy predefined requirements, a second removal transporter 20 for integrated circuits that do not satisfy the predefined requirements, a carrying device 22, an input signal generator 32, an output signal detection and evaluation unit 34, a control unit 36, and a control connection 38. Integrated circuits 12 that are to be tested are delivered by the delivery transporter 16, for example, a conveyer belt, and are gripped by the gripping device 14, which can be movable in multiple directions, such as an X and Y direction, and transported to the support plate 22. The support plate 22 has input signal contacts 24, 26 and output signal contacts 28, 30. The input signal contacts 24, 26 are connected to the input signal generator 32 and the output signal contacts 28, 30 are connected to the output signal detection and evaluation unit 34.

The input signal generator 32 stimulates the integrated circuit 12, which is placed on the contacts 24, 26, 28, 30 and responds thereto with a change in its output signal. The output signal change is detected and evaluated by the output signal detection and evaluation unit 34. Depending on whether the tested integrated circuit 12 satisfies or does not satisfy predetermined requirements, it is transported by the gripping device 14 to the first removal transporter 18 or the second removal transporter 20. The gripping device 14, the delivery transporter 16, and the first and second removal transporerst 18 and 20 can be controlled by a control 36, which communicates via a control connection 38, for example, a bus system, with the input signal generator 32 and/or the output signal detection and evaluation unit 34. The testing apparatus 10 according to FIG. 1 is distinguished by the fact that it derives the predetermined condition, at the occurrence of which a measured value of the output signal of the integrated circuit is detected to evaluate the function of the integrated circuit 12, from a time response of the output signal. The process sequences according to the example embodiments are explained in the following with reference to FIGS. 2 to 5.

FIG. 2a shows a time form of a stimulating input signal. In FIG. 2b, there is shown individual and different responses of different integrated circuits 12 of a production series over time t. In FIG. 2c, there is shown individual test times for the integrated circuits 12, which produce output signals according to FIG. 2b. The test begins with a change in the input signal 40 that is supplied by the input signal generator 32 at time t_0. After a minimum waiting time has passed, at time t_1 the active test, i.e., a continuous monitoring of the output signal of the integrated circuit 12 that is to be tested and thereby the time response of the output signal, is started. The continuous monitoring can be performed, for example, by periodic sampling or continuous evaluation. The time t_1 is shown in FIG. 2 by the falling level of the signal 42 in FIG. 2c, which marks the beginning of the active test time.

FIG. 2b shows starting signal forms 44, 46, and 48 of three different integrated circuits 12, which differ in their response rate. Of the three examined output signal forms 44, 46, and 48, the output signal form 48 responds most rapidly to a change of the input signal at time t_0, and at time t_1_48 enters a predetermined value range I_1. In an example embodiment of the invention, the entry into the value range I_1 can already be evaluated as satisfying the predetermined condition. Within the scope of this embodiment, the test for these special IC can therefor end at this time.

Within the scope of further example embodiment, the process waits for a certain time until time t_2_48, and the then present value of the output signal 48 is used as the measured value for evaluating the integrated circuit 12. Within the scope of this embodiment, the predetermined condition is regarded as having been satisfied when the time t_2_48=t_1_48+$\Delta$_t is reached. In this case, the test measurement is ended, which is represented in FIG. 2c by a rising edge 50. Alternatively, the time t_2_48 can also be determined by evaluating the slope of the output signal 48. The initially steep slope declines after time t_1_48 as it approaches time t_2_48, so that falling below a suitable threshold can define the time t_2_48.

The output signal forms 46 and 44, which are obtained by measuring other integrated circuits 12, can be evaluated very analogously to these considerations on the output signal form 48. The output signal 46 represented by output signal form 46 at time t_1_46 enters the value range I_1 and is detected, for example, at time t_2_46 for evaluating the functionality of the integrated circuit 12. Accordingly, the test measurement for this integrated circuit 12 can be terminated at time t_2_46, as represented in FIG. 2c by a rising edge 52.

Accordingly, an end of the test, which is represented in FIG. 2c by a rising edge 54, results from the times t_1_44, at which the output signal 44 enters the range value I_1, and the associated time t_2_44, at which a measured value is received.

The rising edge 56 in FIG. 2 represents an inevitable termination of the test at a time t_max. If the predetermined condition for detecting an output signal 44, 46, 48 of a special integrated circuit 12 is not yet satisfied at this time t_max, then, for example, the current value of the output signal 44, 46 48 can be used as the measured value for evaluating the functionality, and compared with predefined thresholds. The provision of the maximum test time t_max prevents a potentially nonfunctional IC from blocking the testing apparatus 10 for an unallowably long time.

The time t_max defines simultaneously an example of the time when the measured values for each individual IC 12 are received in the aforementioned prior-art method. The entire measuring time for many integrated circuits 12 according to the prior-art method therefore has a bottom limit determined by multiple time intervals between times t_1 and t_max. In contrast, a comparable (theoretical) bottom limit arises for a testing method according to the invention as the sum of the distances from each of the edges 50, 52, and 54 at time t_1, which, as is evident, results in a smaller sum and thereby overall a shortening of the test time for a multitude of integrated circuits 12.

As an alternative to the already described embodiments, an integrated circuit 12 can also be evaluated in that after the output signal 44, 46, 48 enters the predetermined value range I_1, a percent change in the output signal 44, 46, 48 can be determined and compared with a predetermined threshold. The percent change can be standardized, for example, to the value of the output signal 44, 46, 48 at the time of entry into the predetermined value range I_1.

FIG. 3b shows signal forms 58, 60, 62 of individual integrated circuits 12, which right at the beginning of the test lie within the permitted, predetermined value range I_1. In this case, a reliable evaluation can be achieved in that the output signal forms 58, 60, 62 after time t_1, are detected continuously and monitored for the occurrence of a percent change that exceeds a predetermined threshold. The percentage change is advantageously related to the initial level of the output signal forms 58, 60, 62. As soon as the change in the output signal 58, 60, 62 exceeds a percent threshold, which is the case in FIG. 3b at times t_1_58, t_1_60, and t_1_62, the circuit 12 in question can be evaluated as functional.

Alternatively, at these times, each of the values of the output signal 58, 60, 62 of the integrated circuit 12 that is being tested can be detected and compared with predefined thresholds, which may be identical or different from the limits of the predetermined value range I_1.

Within the scope of another embodiment, which is explained below with reference to the output signal 58, the process waits until time t_2_58. The then available value for the output signal 58 is used as the measured value for evaluating the integrated circuit 12. Within the scope of this embodiment, the condition is therefore regarded as satisfied when the time t_2_58=t_1_58+Δ_t is reached. In this case, the test measurement is ended, which is represented in FIG. 3c by a rising edge 64. Alternatively, time t_2_58 can also be determined by evaluating the slope of signal 58. The steep slope after time t_1_58 declines as the time t_2_58 is approached, so that falling below a corresponding threshold can define the time t_2_58. The output forms 60 and 62 can also be evaluated analogously to these considerations on the output signal form 58.

Accordingly, the testing of an integrated circuit 12 according to example embodiment shown in FIG. 3 ends in each case at the rising edges 64, 66, and 68, all of which occur prior to the rising edge 56, which represents an inevitable termination of the test at time t_max.

Figure 4:
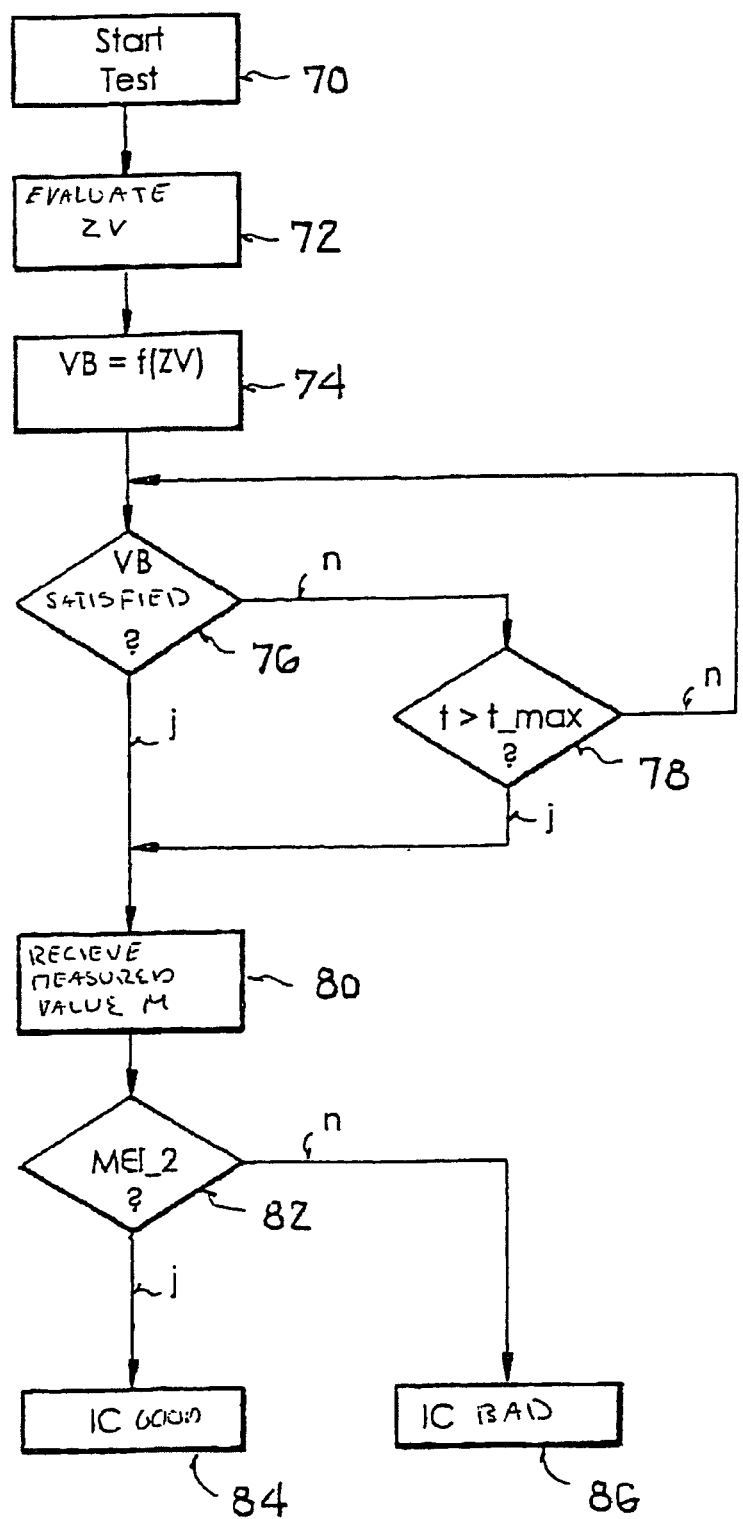
FIG. 4 is a flowchart of an example embodiment according to the present invention.

FIG. 4 is a flow chart in which the signal forms, shown in FIGS. 2 and 3, can be achieved and evaluated. The method is carried out in, for example, the testing apparatus 10 according to FIG. 1 by the connection from the control 36 with the input signal generator 32 and the output signal detection and evaluation unit 34. To that end, in step 70, a test is first started when the gripping device 14 has placed IC 12 on the carrier plate 22. After the placement of an IC 12 onto the contacts 24, 26, 28, 30, an input signal change is triggered and in step 72, the time response ZV of the resulting output signal AS; 44, 46, 48; 58, 60, 62 is evaluated. Next, in step 74, a predetermined condition VB is set as a function of the time response ZV.

While the output signal AS; 44, 46, 48; 58, 60, 62, is continuously detected further, it is checked in step 76 whether the predetermined condition is satisfied. As long as this is not the case, branching occurs in step 78, in which it is checked whether the maximum test time t_max has been exceeded. If the answer to this query in step 78 is no, the loop of 76 and 78 is run until either the predetermined condition is satisfied in step 76 or the maximum test time in step 78 is exceeded. In both cases, a branching follows to step 80, in which a measured value M of the output signal AS; 44, 46, 48; 58, 60, 62 of the integrated circuit 12 is received.

The received measured value M is checked in step 82 to see whether it is an element of a permitted value range I_2. It is understood that I_2 can be identical to or different from the value range I_1, which is described in regards to FIGS. 2 and 3. If the measured value M is within interval I_2, the tested IC 12 is regarded as functional and branching to step 84 occurs, which triggers the removal of the sufficiently functional integrated circuit 12 via the first removal transporter 18. Otherwise, if the measured value M is not within the interval I_2, branching to step 86 occurs, in which, for example, the tested IC 12 is removed by the second removal transporter 20.

Figure 5:
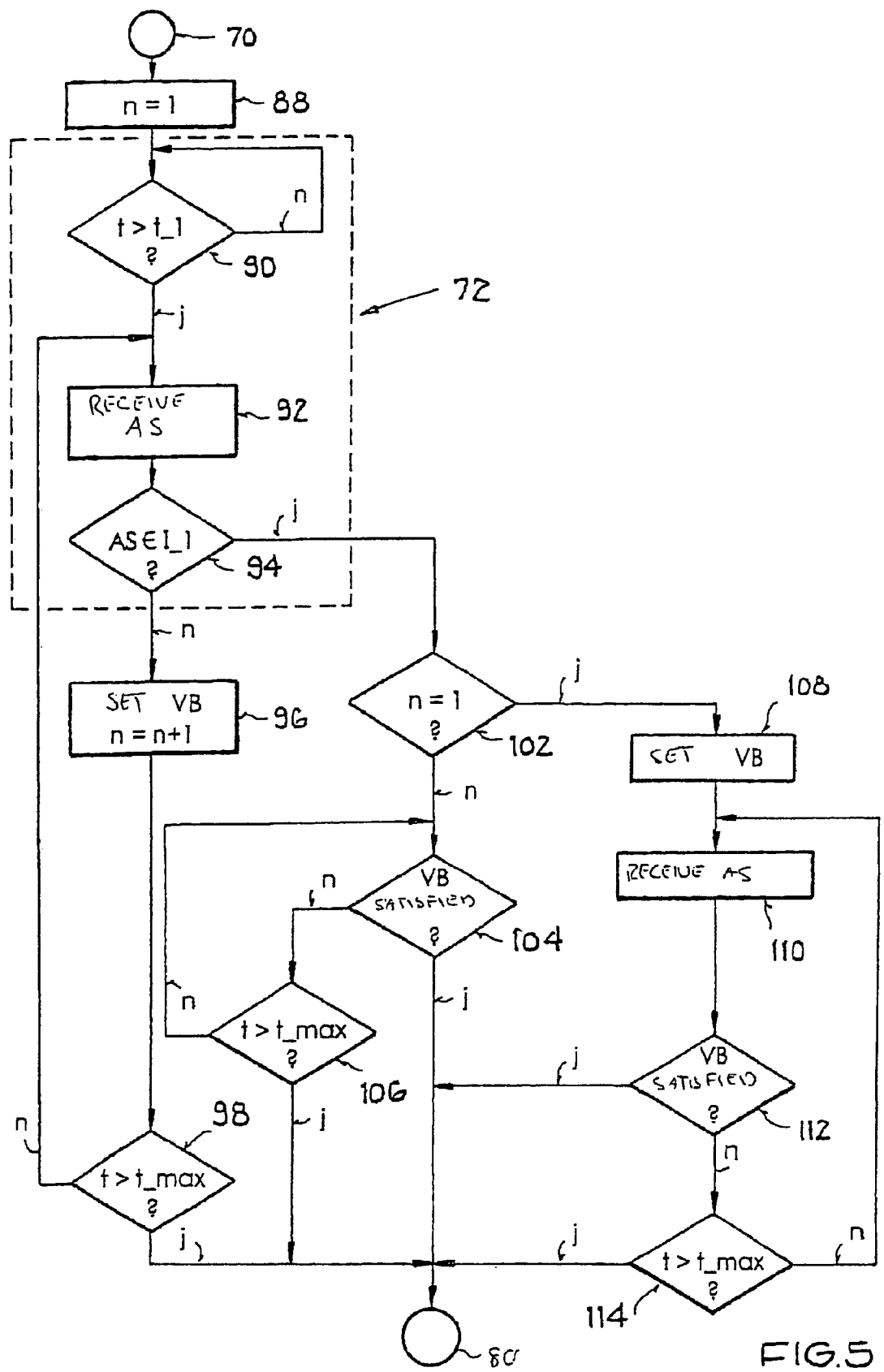
FIG. 5 is another flowchart illustrating a further example embodiment.

According to this description of a very general method, a detailed embodiment of a method is described below with reference to FIG. 5, with which the signal form according to FIG. 2, as well as the signal form according to FIG. 3, can be achieved and evaluated. After the start of the program in step 70, a counter variable n is first set to the value 1. This is followed by step 72 of the evaluation of the time response ZV of the output signal AS; 44, 46, 48; 58, 60, 62 of an integrated circuit 12. The evaluation of the time response ZV is shown in more detail in FIG. 5 and begins with substep 90 of step 72, in which it is checked whether the minimum waiting time, explained in association with FIGS. 2 and 3, until time t_1 has passed. Only when this is the case, branching to substep 92 occurs, in which an output signal AS; 44, 46, 48; 58, 60, 62 of the integrated circuit 12 is received. This is followed by substep 94, in which the output signal AS; 44, 46, 48; 58, 60, 62 is checked to determine whether it is within the predetermined value range I_1. If this is not the case, which corresponds to the output signal response shown in FIG. 2, step 96 follows, in which one of the predetermined conditions VB, explained in association with FIG. 2, is set. In addition, in step 96 the value of the counter variable n is increased by 1.

It is then checked in step 98 whether the maximum test time t_max has passed. As long as this is not the case, branching back to substep 92 occurs, in which a new output signal AS; 44, 46, 48 is received. This is again followed by step 94, which means a determination whether the value AS is within the interval I_1. As long as this is not the case and the maximum test time t_max is not exceeded, the loop runs through steps 92, 94, 96, and 98, whereby the value of the counter variable n is increased each time and thereby is always different from n=1. The loop is left only if it is determined in step 94 that the output signal AS; 44, 46, 48 enters the permitted value range I_1; because the counter variable n in this case is greater than 1, with a no answer to the corresponding query in step 102, step 104 is reached in which it is checked whether the predetermined condition VB is satisfied.

As long as this is not the case, branching from step 104 to step 106 occurs, in which it is checked whether the maximum test time t_max has been reached. Branching to step 80 occurs only when the predetermined condition in step 104 is recognized as having been satisfied or if the predetermined maximum test time t_max in step 106 is recognized as having been exceeded; this has already been explained in regard to FIG. 4 and relates to the receiving of the measured value and further branching in steps 82, 84, 86 of FIG. 4. Step 80 is also reached when the loop, including steps 92, 94, 96, and 98, is left from step 98 due to exceeding the maximum test time t_max.

If the output signal at time t_1 is within the permitted range I_1, as corresponds to the situation in FIG. 3, the form of the process is slightly different. In this case, the query in substep 94 of step 72 is answered with yes during the first pass and step 102 is reached, in which it is checked whether the counter variable n has the value 1. Because this is the case with only a single pass through the preceding step 94, the query 102 in this case is answered with yes and step 108 follows, in which one of the predetermined conditions VB, explained in relation to FIG. 3, is set. Next, in step 110 an output signal AS; 58, 60, 62 is received and evaluated in step 112 as to whether the set predetermined condition VB is satisfied. As soon as the predetermined condition VB has been satisfied, also in this embodiment of the method, branching in step 80 to receive a measured value for the output signal AS; 58, 60, 62 follows as a basis for evaluating the functionality of the integrated circuit 12.

As long as the predetermined condition has not been satisfied and the maximum time t_max, checked in step 114, has not yet been reached, the sequence includes steps 110, 112, and 114 is repeatedly run through. As in the previous described embodiment, this loop is also left either because the predetermined condition in step 112 is recognized as having been satisfied or because the maximum test time t_max in step 114 has been detected as having been exceeded.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for testing an integrated circuit, the method comprising the steps of:
    providing an input signal to the integrated circuit, the integrated circuit providing an output signal on the basis of the input signal;
    changing a value of the input signal;
    detecting a change in the output signal of the integrated circuit on the basis of the changed input signal;
    determining whether the change in the output signal is within a predetermined threshold; and
    determining whether the change in the output signal is within a predetermined time period, the predetermined time period starting at a time that the value of the input signal was changed,
    wherein, on the basis of the determination of whether the change in the output signal is within a predetermined threshold and within a predetermined time period, the testing of the integrated circuit is concluded based on when the changed output signal is within the predetermined threshold.

2. The method according to claim 1, wherein the testing of the integrated circuit is concluded substantially simultaneously when the changed output signal is within the predetermined threshold.

3. The method according to claim 1, wherein the testing of the integrated circuit is performed by a testing apparatus to determine whether or not the integrated circuit meets a predetermined performance criteria.

4. The method according to claim 3, wherein the testing apparatus tests a plurality of integrated circuits to determine whether or not the integrated circuits meet the predetermined performance criteria.

5. The method according to claim 1, wherein the input signal and/or the output signal are an analog signal and/or a digital signal.

* * * * *